United States Patent [19]
Horino et al.

[11] Patent Number: 5,637,880
[45] Date of Patent: Jun. 10, 1997

[54] METHOD FOR EXTRACTING ION CURRENT FROM SPACE OF HIGH VACUUM INTO SPACE OF LOW VACUUM

[75] Inventors: Yuji Horino, Ikeda; Kanenaga Fujii, Hyogo-ken; Akiyoshi Chayahara, Ikeda; Atsushi Kinomura, Ikeda; Yoshiaki Mokuno, Ikeda, all of Japan

[73] Assignee: Agency of Industrial Science & Technology Ministry of International Trade & Industry, Tokyo, Japan

[21] Appl. No.: 580,817

[22] Filed: Dec. 29, 1995

[30] Foreign Application Priority Data

Jan. 12, 1995 [JP] Japan ................................ 7-020938

[51] Int. Cl.$^6$ ........................ H01J 37/08; H01J 33/04
[52] U.S. Cl. ................... 250/505.1; 250/492.3; 250/503.1; 313/359.1; 313/363.1; 313/420
[58] Field of Search ................ 250/505.1, 503.1, 250/492.3; 313/420, 363.1, 359.1

[56] References Cited

U.S. PATENT DOCUMENTS 5,173,612  12/1992  Imai et al. .................... 250/505.1
5,509,046   4/1996  Logan .......................... 250/505.1

OTHER PUBLICATIONS

H. Koyama–Ito, et al., "Micro–PIXE Analyses of Thick Frozen Lenses with Cataracts", Nuclear Instruments and Methods in Physics Research B75, (pp. 518–520).

*Primary Examiner*—Jack I. Berman
*Attorney, Agent, or Firm*—Oblon, Spivak, McClelland, Maier & Neustadt, P.C.

[57] ABSTRACT

A method for the extraction of an ion current from a space of a high degree of vacuum into a space of a low degree of vacuum comprises interposing between the space of the high degree of vacuum and the space of the low degree of vacuum an ion current thin film formed of a member having a uniform crystal orientation and causing the ion current to pass from the space of the high degree of vacuum through the thin film into the space of the low degree of vacuum.

2 Claims, 1 Drawing Sheet

ANGULAR INTENSITY DISTRIBUTION OF ION CURRENT RELATIVE TO THE DIRECTION PERPENDICULAR TO THIN FILM

METHOD FOR EXTRACTING ION CURRENT FROM SPACE OF HIGH VACUUM INTO SPACE OF LOW VACUUM

BACKGROUND OF THE INVENTION

1. Field of the Invention

This invention relates to a method for extracting an ion current, to be used, for example, in the analysis of a solid surface by means of an ion beam, from a space of high vacuum into a space of low vacuum.

2. Prior Art of the Invention

As a means for extracting a moving ion current from a space of a high degree of vacuum into a space of a low degree of vacuum, a method which comprises interposing a polycrystalline metal film or a polymer film having a thickness of about 5 to 6 μm or a substance having pores of a diameter of about 5 to 6 μm as an ion current thin film between the two spaces and passing the ion current through the interposed ion current thin film is known to the art. When the extraction is conducted using a polycrystalline metal film or a polymer film, however, the ions in the ion current scatter on colliding with atoms or molecules in the web of the film and, as a result, the density of the ion current falls abruptly and the energy of the ion current also drops sharply. Further, it is difficult to apply the above method to an ion current of high density because the strength of the film is degraded by frequent collisions between the ions and the component atoms or molecules of the film. The problem is particularly severe when a low-strength polymer film is used because the film is easily damaged and has to be frequently replaced, while susceptibility of the film to breakage makes it necessary to equip the apparatus with a mechanism for the protection of vacuum. In contrast, the method of passing the ion current through pores in the substance encounters difficulty when the current consists ions of a diameter on the millimeter order because the need to maintain a pressure difference (or difference in vacuum degree) between the two spaces separated by the pores makes it impossible to increase the size of the pores beyond a certain level.

Although the extraction of ion current from a space of a high degree of vacuum into the space of a low degree of vacuum is already an important technique in solid surface analysis, it is also now being studied for possible application to the modification of the surface of a metal such as steel in the air.

A strong need is therefore felt for the development of a technique capable of extracting an ion current from a space of a high degree of vacuum into a space of a low degree of vacuum without involving any of the drawbacks mentioned above.

The present inventors pursued a study with a view to providing such a method and discovered that when a thin sheet having a uniform crystal orientation is interposed between a space of a high degree of vacuum and a space of a low degree of vacuum and an ion current is passed from the space of the high degree of vacuum through the thin sheet into the space of the low degree of vacuum with a channeling state maintained between the two spaces, the likelihood of the ion current suffering a decrease in density and the thin sheet sustaining damage is virtually nil. This invention was accomplished as a result.

SUMMARY OF THE INVENTION

This invention pertains to a method which comprises interposing between a space of a high degree of vacuum and a space of a low degree of vacuum a wall provided in part thereof with an ion current thin film made of a member having a uniform crystal orientation and causing an ion current to pass from the space of the high degree of vacuum through the thin film into the space of the low degree of vacuum.

DESCRIPTION OF THE PREFERRED EMBODIMENT

As used in this invention, the term "space of a high degree of vacuum" means a space having a degree of vacuum of not less than $1.00 \times 10^{-5}$ Torr and the term "space of a low degree of vacuum" means a space having a degree of vacuum of less than $1.00 \times 10^{-5}$ Torr.

Concrete examples of the ion current thin film of a uniform crystal orientation contemplated by this invention include thin sheets of a single crystal such as silicon single crystal (p type, <100> plane), diamond, and graphite. Besides thin sheet of single crystal, pyrographite may be cited as a crystal body having a crystal orientation in a fixed direction. The thickness of the thin film is preferably in the approximate range of 1 to 5 μm, though it is not particularly critical.

This invention will now be described in detail with reference to the drawings.

Figure 1:
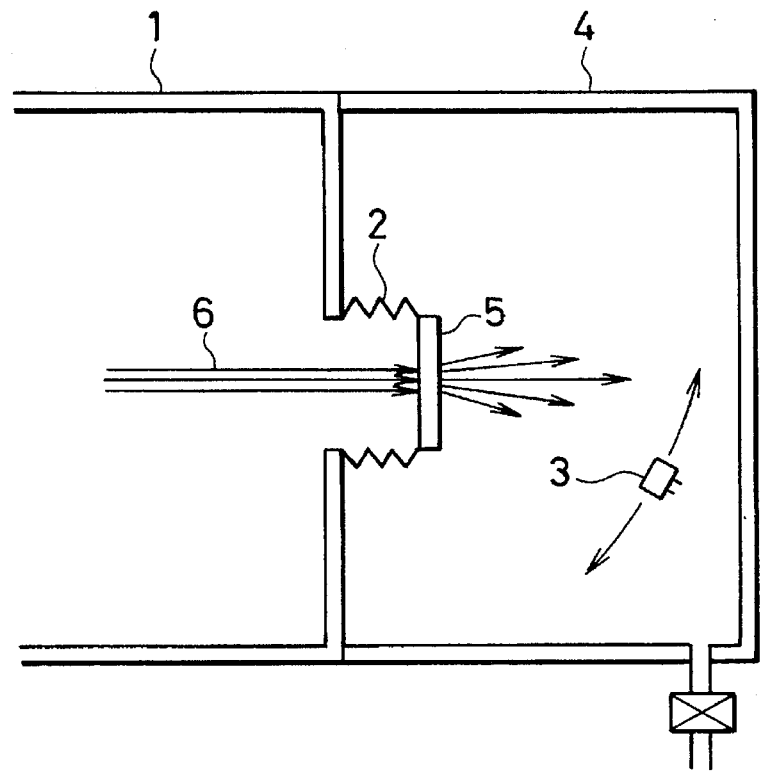
FIG. 1 is a schematic cross section showing one example of an apparatus for implementing the method of this invention.

One example of an apparatus for implementing the method of this invention is schematically illustrated in FIG. 1.

In FIG. 1, 1 stands for a space of a high degree of vacuum, 4 for a space of a low degree of vacuum which adjoins the space of a high degree of vacuum, 5 for an ion current thin film, and 2 for a mechanism provided so as to permit fine adjustment of the orientation of the thin film 5 and consequently maintain the channeling state of an ion current while the ion current is in motion toward the thin film.

The 4 of a low degree of vacuum is preferably filled with a gas such as argon gas which does not particularly affect the ion current.

When the method of this invention is worked by the use of the apparatus shown in FIG. 1, a given ion current 6 advances toward the surface of the thin film 5 so as to travel parallelly to the direction of crystal orientation. As a result, the ion current can be extracted from the space 1 of a high degree of vacuum into the space 4 of a low degree of vacuum by channeling, without scattering the ion current or notably lowering the density of the ion current or the energy of the ion current. The energy of the ion current is not particularly critical so long as it allows utilization of the channeling phenomenon.

This method of this invention does not particularly limit the ions which form the ion current as regards kind of element. They may be positive or negative in polarity. When an ion current has low energy, the ions of the current may undergo conversion of electric charge while the ion current is in the process of passing through the thin film 5. This case is embraced in the scope of this invention.

In accordance with this invention, since the ions in the ion current have practically no possibility of colliding with the atoms or molecules in the web of the thin film, the ion current can be extracted out of the space of a high degree of vacuum without entailing appreciable loss of the density and energy initially possessed by the ion current.

Further, the thin film can be continuously used for a long time because it has virtually no possibility of sustaining damage due to the ion current.

The method of this invention is capable of implementing the extraction of an ion current without reference to the state of the electric charge of the ion current. It can be effectively applied to an ion current of high density and to an ion current of large diameter ions.

A working example will now be described below with a view to clarifying the features of this invention. The invention is, of course, not limited by this example.

EXAMPLE 1

The method of invention was carried out by the use of the apparatus illustrated schematically in FIG. 1.

Specifically, with the ultimate degree of vacuum of the space 1 of a high degree of vacuum 1 set at a level of not lower than $1.0 \times 10^{-8}$ Torr and the thin film 5 made of a silicon single crystal (p type, <100 plane>) in a thickness of 2 μm, a proton ($H^+$) current having an ion current density of 10 μA/cm$^2$ and an energy of 2 MeV was extracted through the thin film 5 into the space 4 of a low degree of vacuum which was filled with argon gas to a pressure equivalent to the atmospheric pressure.

The ion current immediately after the passage through the silicon single crystal was found to have an energy of 1.98 MeV. This fact indicates that the ion current retained the initial energy virtually intact.

Figure 2:
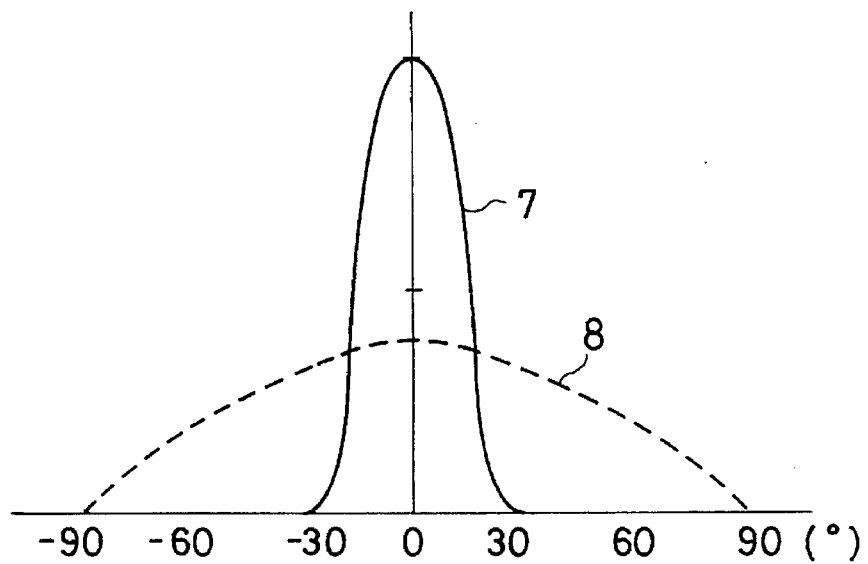
FIG. 2 shows the angular intensity distributions obtained in an example according to the invention and a comparative example, of an ion current relative to the direction perpendicular to a thin film immediately after passage thereof through the thin film.

The intensity of the ion current immediately after passage through the silicon single crystal was measured with a measuring instrument 3 to determine the angular distribution of the intensity relative to the direction perpendicular to the thin film plate. The results are shown by the curve 7 in FIG. 2. The curve clearly indicates that the ion current had excellent in directivity. The measuring instrument 3 was a surface barrier detector.

Comparative Experiment

The extraction of an ion current was carried out by following the procedure of Example 1 except that an aromatic polyimide film having a thickness of 7.5 μm (Capton Film, product of Toray-DuPont K.K.) in the place of the silicon single crystal.

The ion current immediately after passage through the aromatic polyimide film had an energy of 1.54 MeV, indicating that the energy decreased greatly. The angular distribution of the intensity of the ion current immediately after passage through the aromatic polyimide film was measured in the same way as in the above Example. The results are shown by the curve 8 in FIG. 2, from which it can be seen that the directivity of the ion current was inferior.

What is claimed is:

1. A method for the extraction of an ion current from a space of a high degree of vacuum into a space of a low degree of vacuum by interposing between said space of the high degree of vacuum and said space of the low degree of vacuum a wall provided in part thereof with an ion current thin film formed of a member having a uniform crystal orientation and causing said ion current to pass from said space of the high degree of vacuum through said thin film into said space of the low degree of vacuum, wherein said thin film member of a uniform crystal orientation is pyrographite.

2. A method for the extraction of an ion current from a space of a high degree of vacuum into a space of a low degree of vacuum by interposing between said space of the high degree of vacuum and said space of the low degree of vacuum a wall provided in part thereof with an ion current thin film formed of a member having a uniform crystal orientation and causing said ion current to pass from said space of the high degree of vacuum through said thin film into said space of the low degree of vacuum, wherein said thin film member of a uniform crystal orientation is a thin single crystal sheet and wherein the single crystal of said thin single crystal sheet is one member selected from the group consisting of p type silicon crystal having a <100> plane orientation, diamond crystal, and graphite.

* * * * *